(12) United States Patent
Roohparvar

(10) Patent No.: US 6,873,507 B2
(45) Date of Patent: *Mar. 29, 2005

(54) ELECTROSTATIC DISCHARGE PROTECTION WITH INPUT IMPEDANCE

(75) Inventor: Frankie F. Roohparvar, Milpitas, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/704,768

(22) Filed: Nov. 10, 2003

(65) Prior Publication Data

US 2004/0095697 A1 May 20, 2004

Related U.S. Application Data

(63) Continuation of application No. 09/803,156, filed on Mar. 9, 2001, now Pat. No. 6,678,133.

(51) Int. Cl.⁷ .................................................. H02H 9/00
(52) U.S. Cl. ...................................................... 361/56
(58) Field of Search ........................ 361/56, 91.1, 111, 361/119; 257/355, 356, 357, 358, 359

(56) References Cited

U.S. PATENT DOCUMENTS

| | | |
|---|---|---|
| 5,218,222 A | 6/1993 | Roberts |
| 5,270,565 A * | 12/1993 | Lee et al. ............... 257/358 |
| 5,293,057 A | 3/1994 | Ho et al. |
| 5,336,908 A | 8/1994 | Roberts |
| 5,430,602 A | 7/1995 | Chin et al. |
| 5,581,104 A | 12/1996 | Lowrey et al. |
| 5,654,860 A | 8/1997 | Casper et al. |
| 5,656,967 A | 8/1997 | Casper et al. |
| 5,717,559 A * | 2/1998 | Narita ...................... 361/56 |
| 5,721,658 A | 2/1998 | Ma et al. |
| 5,744,839 A | 4/1998 | Ma et al. |
| 5,767,552 A | 6/1998 | Casper et al. |
| 5,805,009 A | 9/1998 | Casper et al. |
| RE36,024 E | 1/1999 | Ho et al. |
| 5,880,917 A | 3/1999 | Casper et al. |
| 5,889,644 A | 3/1999 | Schoenfeld et al. |
| 5,982,599 A | 11/1999 | Ma et al. |
| 6,004,838 A | 12/1999 | Ma et al. |
| 6,040,733 A | 3/2000 | Casper et al. |
| 6,130,811 A | 10/2000 | Gans et al. |
| 6,137,664 A | 10/2000 | Casper et al. |
| 6,181,540 B1 | 1/2001 | Schoenfeld et al. |
| 6,204,537 B1 | 3/2001 | Ma |
| 6,678,133 B2 * | 1/2004 | Roohparvar ............. 361/56 |

* cited by examiner

Primary Examiner—Ronald Leja
(74) Attorney, Agent, or Firm—Leffert Jay & Polglaze PA

(57) ABSTRACT

An input circuit for an integrated circuit includes an electrostatic discharge circuit. The input circuit incorporates an interconnect pad, an ESD protection resistor, and an interconnect line that are coupled to the active internal components of the integrated circuit. The interconnect pad is coupled to the interconnect line, and the interconnect line is coupled to the ESD protection resistor which is coupled to the active internal components of the integrated circuit. The ESD protection resistor is positioned physically proximate to the active internal components of the integrated circuit and adjusted in value to compensate for the intrinsic resistance or RC time constant of the interconnect line. The circuitry provides for a lower signal propagation delay through the external connection because of lower RC time constants to drive the capacitance of the interconnect.

35 Claims, 3 Drawing Sheets

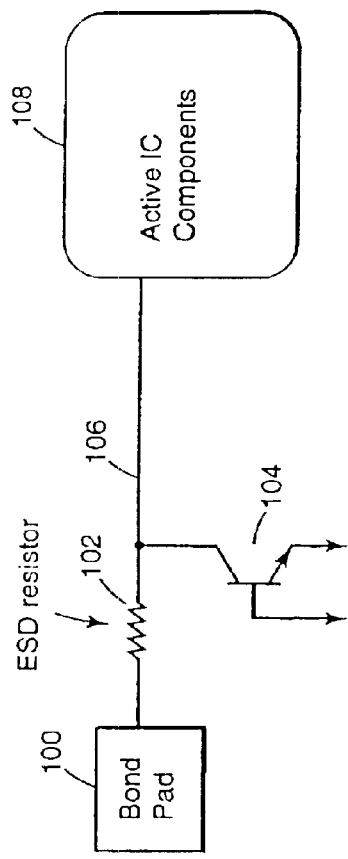
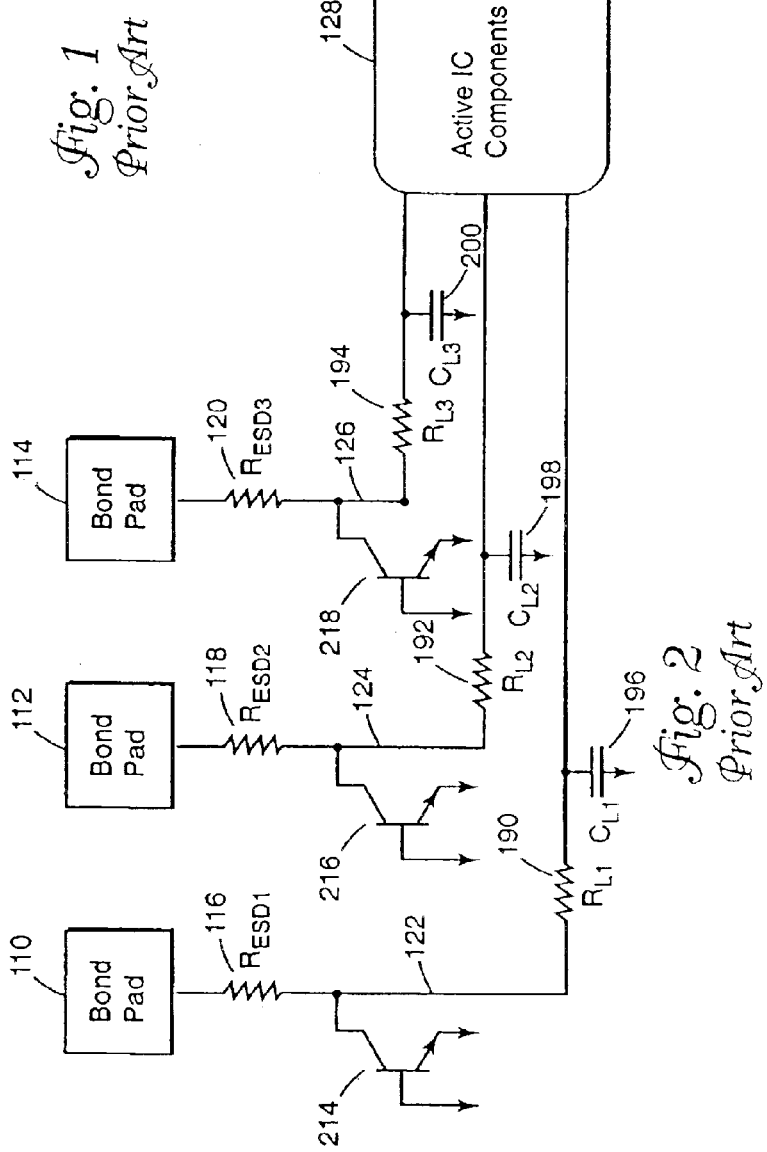

ELECTROSTATIC DISCHARGE PROTECTION WITH INPUT IMPEDANCE

RELATED APPLICATION

This Application is a Continuation of U.S. application Ser. No. 09/803,156 filed Mar. 9, 2001 now U.S. Pat. No. 6,678,133, which is incorporated herein by reference.

TECHNICAL FIELD OF THE INVENTION

The invention relates to integrated circuits, and more particularly, to electrostatic discharge protection circuits.

BACKGROUND OF THE INVENTION

Electrostatic discharge (ESD) voltage and current can be a major source of damage for integrated circuits. ESD can be a problem with an integrated circuit that is not in operation or coupled to a circuit. At these times, many of the integrated circuit's external connections are floating and exposed to damage. The potential for ESD damage has become even more of a predominant issue with the decreasing device sizes, spacing, and operating voltages of modern components, all of which has the effect of increasing the likelihood of an ESD event causing damage.

The primary object of most common types of ESD protection is to isolate vulnerable internal circuitry from an ESD event. An integrated circuit connects to its external environment through interconnect pads (also referred to as die terminals, bond pads, die pads, or contact pads). Typically an ESD protection circuit is incorporated at, or shortly after, the interconnect pad in an integrated circuit and contains breakdown devices and current limiting devices that provide an alternative and more durable path for the damaging ESD voltage and current to flow through. ESD protection circuitry, however, while necessary for ESD event survival, can interfere with signal transmission speed and increase capacitive loading when the integrated circuit is operation. Therefore in ESD protection circuitry a balance is sought which preserves signal speed while not over exposing the integrated circuit to damage from ESD.

Various techniques have been utilized in constructing ESD protection circuits for integrated circuits and are well know to those skilled in the art. One such common ESD technique is to incorporate an input buffer of more durable circuit components between the interconnect pad and the internal active circuitry that is capable of better absorbing the elevated potentials of a given ESD event. However, these heavier duty components typically also have a higher input drive requirements and corresponding signal propagation delays that can become unacceptable to the design specifications of the integrated circuit. Another technique is to incorporate one or more clamping diodes or other such breakdown circuits that couple an ESD event to a discharge path away from the more damage susceptible input components. A further technique is to incorporate "guard rings" of opposite carrier, or over doped similar carrier, semiconductor that form a protecting diode or conduction path system around the input circuitry and interconnect pads.

A common ESD protection technique is to incorporate a resistance into the integrated circuit input just after the interconnect pad. One of the effects of this input resistance has is to current limit the ESD event. An ESD damping input resistance incorporated at the interconnect pad helps dissipate an ESD event quickly and contain it near the interconnect pad. Unfortunately, this technique can cause a significant signal propagation delay issue by adding a higher RC time constant when the ESD input resistance is combined with the capacitive load of the input circuit and interconnect line. Unless the external drive of the integrated circuit input is made larger, it now will take longer to charge the input interconnect's capacitive load through the ESD protection resistance. The reduction in device and feature size in modern integrated circuits has increased resistance of the interconnect lines themselves to become a significant factor in the total input resistance. These interconnect line resistances add to the ESD resistance giving a larger effective input resistance than intended. Furthermore, the interconnect resistances tend to be of variable size, as the input interconnect lines are of differing lengths and cross section. This leads to issues of varying RC time delay on different input lines, a significant issue in high speed and synchronous design.

For the reasons stated above, and for other reasons stated below which will become apparent to those skilled in the art upon reading and understanding the present specification, there is a need in the art for a system to reduce signal delay from ESD. Additionally there is a need for the ability to have matched delays or resistances across inputs.

SUMMARY OF THE INVENTION

The above-mentioned problems with ESD input resistance and other problems are addressed by the present invention and will be understood by reading and studying the following specification.

In one embodiment, an integrated circuit comprises an interconnect pad, an interconnect line having a first end coupled to the interconnect pad, a resistor coupled to an opposite second end of the interconnect line, wherein the resistor is adjusted to compensate for an inherent resistance of the interconnect line, and an electrostatic protection circuit coupled to the resistor.

A method for coupling an external signal to the input of an integrated circuit comprises receiving an external signal at an interconnect pad, coupling the signal to a conductor line, coupling the signal from the conductor line to a resistor, wherein the resistor has been selectively adjusted to compensate for an internal resistance of the conductor line, coupling the resistor to an electrostatic protection circuit, and coupling the signal from the resistor to an internal circuit.

Another method of adjusting an integrated circuit for a specific input resistance comprises coupling an interconnect pad to an interconnect line, coupling the interconnect line to a resistor, coupling the resistor to an internal circuit of the integrated circuit, coupling the resistor to an electrostatic protection circuit, and adjusting the resistor to achieve a specific input resistance for the integrated circuit and compensate for a resistance of the interconnect line.

In a further method of adjusting an integrated circuit for a specific input RC time constant comprises coupling an interconnect pad to an interconnect line, coupling the interconnect line to a resistor, coupling the resistor to an internal circuit of the integrated circuit, adjusting the resistor to achieve the specific input RC time constant for the integrated circuit, compensating for a resistance and capacitance of the interconnect line, and coupling the resistor to an electrostatic protection circuit.

In another embodiment a memory device comprises an address interface coupled to a first interconnect pad circuit, a first interconnect circuit coupled to the first interconnect pad circuit, a first resistor circuit coupled to the first interconnect circuit, wherein the first resistor circuit is adjusted to compensate for a resistance of the first interconnect circuit, a data interface coupled to a second interconnect pad circuit, a second interconnect circuit coupled to the second interconnect pad circuit, a second resistor circuit coupled to the second interconnect circuit, wherein the second resistor circuit is adjusted to compensate for a resistance of the second interconnect circuit, a control interface coupled to a third interconnect pad circuit, a third interconnect circuit coupled to the third interconnect pad circuit, and a third resistor circuit coupled to the third interconnect circuit, wherein the third resistor circuit is adjusted to compensate for a resistance of the third interconnect circuit.

In a further embodiment, an electrostatic discharge protection circuit comprises an interconnect pad coupled to a conductor, a resistor coupled to the conductor, wherein the resistor is adjusted to compensate for a resistance of the conductor such that the combined resistance of the resistor and the resistance of the conductor are substantially equal to a predefined value, and an electrostatic discharge circuit coupled to the resistor.

In yet another embodiment an integrated circuit comprises a first interconnect pad, a second interconnect pad, a first interconnect line having a first end coupled to the first interconnect pad, a second interconnect line having a first end coupled to the second interconnect pad, a first resistor, $R_1$, coupled to an opposite second end of the first interconnect line, where the first resistor is adjusted to compensate for an inherent resistance of the first interconnect line, $R_{L1}$, a second resistor, $R_2$, coupled to an opposite second end of the second interconnect line, where the second resistor is adjusted to compensate for an inherent resistance of the second interconnect line, $R_{L2}$, and such that $R_1+R_{L1}=R_2+R_{L2}$, a first electrostatic protection circuit coupled to the first resistor, and a second electrostatic protection circuit coupled to the second resistor.

In another embodiment an integrated circuit comprises first and second interconnect pads, a first interconnect line having a line resistance of $R_{L1}$, a line capacitance of $C_{L1}$, and a first end coupled to the first interconnect pad, a second interconnect line having a line resistance of $R_{L2}$, a line capacitance of $C_{L2}$, and a first end coupled to the second interconnect pad, a first resistor, $R_1$, coupled to an opposite second end of the first interconnect line, where a value of the first resistor is selected to set a first input RC time constant in combination with the first interconnect line, where the first input RC time constant is $(R_1+R_{L1}) C_{L1}$, a second resistor, $R_2$, coupled to an opposite second end of the second interconnect line, where the second resistor is selected to set a second input RC time constant in combination with the second interconnect line, where the second input RC time constant is $(R_2+R_{L2}) C_{L2}$, and such that $(R_1+R_{L1}) C_{L1}=(R_2+R_{L2}) C_{L2}$, a first selectable electrostatic discharge path coupled to the first resistor, and a second selectable electrostatic discharge path coupled to the second resistor.

BRIEF DESCRIPTION OF THE DRAWINGS

FIG. 1 is a diagram of a prior art integrated circuit input, showing interconnect pad, ESD resistor, an ESD protection device, and active integrated circuit components.

FIG. 2 is a simplified diagram of a prior art integrated circuit with multiple inputs, showing interconnect lengths, interconnect pads, input ESD resistors, and active integrated circuit components.

DETAILED DESCRIPTION OF THE INVENTION

Figure 3:
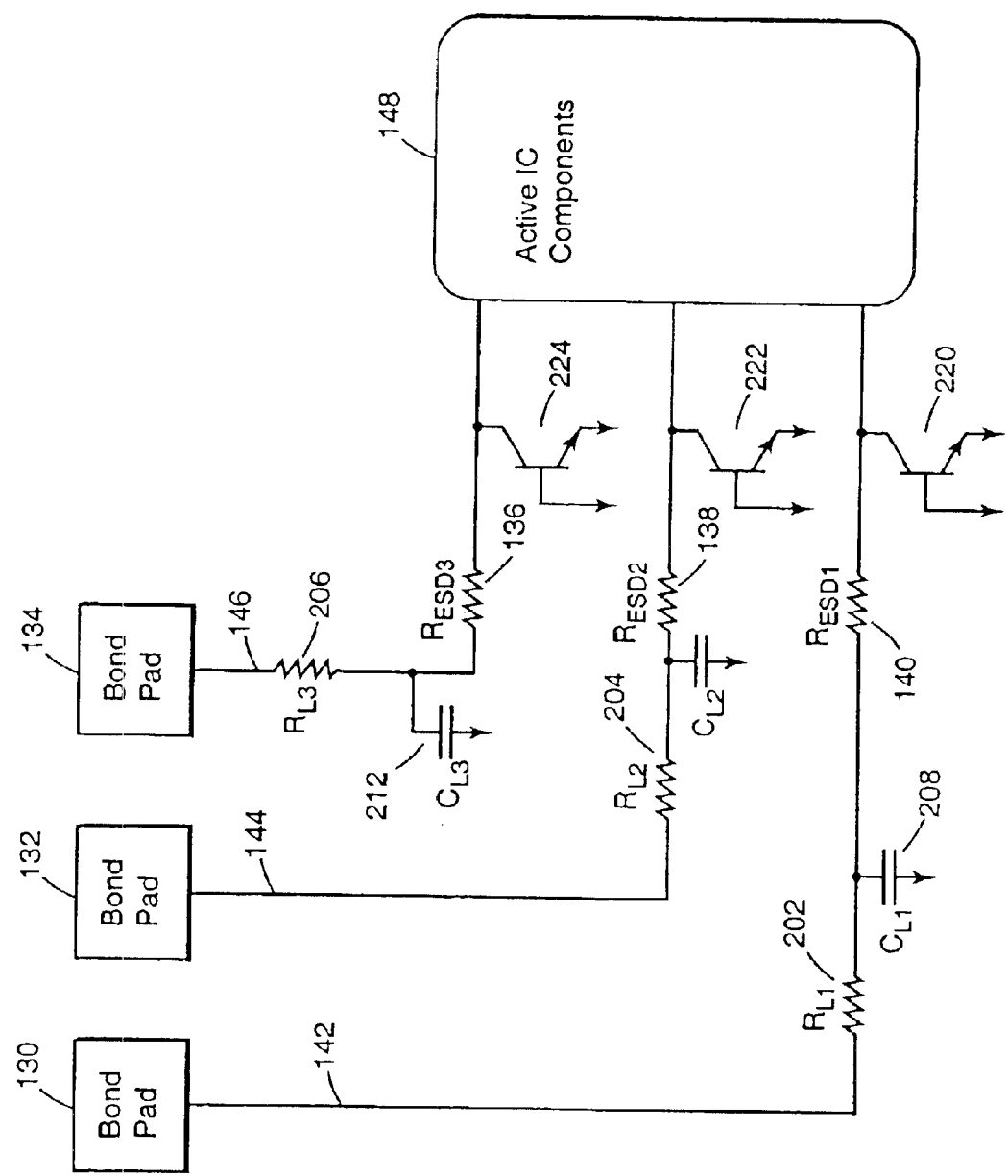
FIG. 3 is a simplified diagram of an integrated circuit with multiple inputs of an embodiment of the present invention.

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

ESD events can be a problem for all external connections of an integrated circuit and present potentially damaging transients. In this respect both inputs and output circuits are vulnerability points for an integrated circuit, even though the more robust circuits that typically comprise an output make it potentially more durable.

FIG. 1 illustrates a simplified example of an integrated circuit input with an interconnect pad 100, an interconnect line 106, an ESD resistor 102, an ESD protection circuit 104, and an internal integrated circuit of active components 108. External input signals come into the integrated circuit through interconnect pad 100 and pass through the coupled ESD resistor 102. They then pass through the coupled interconnect line 106 on their way to the active components of the integrated circuit inputs 108, to be processed as input. The ESD resistor in these applications is typically in the range of 300 ohms to 1 k-ohms. During an ESD transient event, the ESD event signal comes in to the interconnect pad from the external connection leads (not shown), and is damped by the coupled ESD resistor 102. The remaining components of the ESD event trigger the ESD protection circuitry which shunts the damped ESD event away from the interconnect line 106 and the less robust internal active integrated circuit input components 108. The ESD protection circuitry is shown as comprising a diode coupled transistor 104 in FIG. 1, although other alternative ESD protection circuits are well known to those skilled in the art.

Guard rings (not shown) are typically also inserted into the input circuit of FIG. 1. The guard rings, if utilized, are placed to surround the interconnect pad 100, ESD resistor 102, and ESD protection circuitry, if possible, and are designed to localize the ESD event signal to the input circuit and prevent crossover.

FIG. 2 provides an example of a multiple input circuit with interconnect lines of differing lengths. Input signals come into an interconnect pad (110, 112, or 114) to the integrated circuit and are passed through the corresponding coupled ESD resistors (116, 118, or 120). The ESD resistors in turn pass the input signal to their coupled interconnect line (122, 124, or 126) to the active input components internal to the integrated circuit 128. In an ESD transient event, the ESD signal comes into the input circuit of FIG. 2 through the input interconnect pads (110, 112, and 114) to the integrated circuit. The ESD signal is then damped by the ESD resistors (116, 118, and 120), and is shunted away from the active input components internal to the integrated circuit 128 by the ESD protection circuits (214, 216, and 218).

One of the aspects of the input circuit of FIG. 2 is that the interconnect lines (122, 124, and 126) that have a parasitic resistance ($R_{L1}$ 190, $R_{L2}$ 192, and $R_{L3}$ 194) and capacitance (196, 198, and 200). This interconnect line resistance adds to the resistance of the ESD protection resistance to give a input total resistance of $R_{total}=R_L+R_{ESD}$ for each input circuit line.

The parasitic resistance of the interconnects is variable and depends on the resistivity (material) of the interconnect, the cross sectional area, and the length of the interconnect. Generally, the resistance of an interconnect is stated as $R=(\rho\, l)/(w\, t)$, where $\rho$ is resistivity, l is the length of the interconnect, w is the width of the interconnect, and t is the thickness. As stated above, the parasitic resistance ($R_L$) adds to that of the ESD resistor ($R_{ESD}$) to give a total input resistance of $R_{total}=R_L+R_{ESD}$ for an individual input circuit line. The intrinsic line capacitance of an interconnect line can be generally described in silicon as $C=(\epsilon\, w\, l)/t_{ox}$, where $\epsilon$ is permittivity, w is line width, and $t_{ox}$ is the thickness of the oxide. It is noted that this is only the capacitance of the line to the bulk of the silicon of the integrated circuit. Line to line parasitic capacitance is a significant effect that increases with reduced line spacing and is not accounted for with the above calculation. The RC time constant of the line is therefore a product of this $R_{total}$ and any input capacitance, C, and significantly affects the overall line delay of a given input line with a specified signal voltage. Thus the length of the interconnect line adds both undesired resistance and capacitance to the input circuit. These undesired input RC time constants add to the propagation delay of signals through the circuit and can cause problems with setup and hold time requirements for the signal. For example, a typical ESD and input line resistance of 500 ohms and a line capacitance of 2 pf causes a RC time constant of 1ns, which is enough to cause issues in modern circuits where a typical 100 MHz clock speed can give 10 ns clock periods.

In addition, as described above, the interconnect input and output lines of an integrated circuit are typically also of differing lengths. Thus, in the circuit of FIG. 2, while the ESD resistors are of equal values ($R_{ESD}=R_{ESD}=R_{ESD}$), the interconnect line resistances and capacitances are not the same ($R_{L1} \neq R_{L2} \neq R_{L3}$ and $C_{L1} \neq C_{L2} \neq C_{L3}$) because of line length. Therefore, because of the interconnect line resistances, the individual line resistances are not the same ($R_{L1}+R_{ESD} \neq R_{L2}+R_{ESD} \neq R_{L3}+R_{ESD}$). This variation in interconnect length causes differences in the input resistances and RC time constants of grouped signal lines (i.e., data lines or address lines), and propagation times of the grouped signal lines would therefore differ. This can cause problems with setup and hold time requirements of these grouped lines and is not a good circumstance for high speed or synchronous systems.

Shown in FIG. 3 is an integrated circuit of an embodiment of the present invention. The integrated circuit has multiple inputs and interconnect connections of differing lengths. Input signals are received at an interconnect pad (130, 132, or 134) to the integrated circuit and are passed through the corresponding coupled interconnect lines (142, 144, or 146). The interconnect lines (142, 144, or 146) each have a parasitic resistance ($R_{L1}$ 202, $R_{L2}$ 204, and $R_{L3}$ 206) and capacitance (208, 210, and 212). The interconnect lines (142, 144, or 146) in turn pass the input signals to their corresponding coupled ESD resistor (136, 138, or 140). The input signals then pass through the ESD resistors to the active input components internal to the integrated circuit 148. In an ESD transient event, an ESD event signal comes to the circuit into the input circuit of FIG. 2 through the input interconnect pads (130, 132, and 134) and is passed to the corresponding ESD resistors (136, 138, and 140) by the coupled interconnect lines (142, 144, or 146). The incoming ESD event signal is then damped by the ESD resistors (136, 138, and 140), and is shunted away from the active input components 128 by the ESD protection circuits (220, 222, and 224).

In the circuit of FIG. 3, the ESD resistors (136, 138, and 140) are placed after the interconnect lines (142, 144, or 146) proximate to the active circuitry of the integrated circuit 148. It is noted that the prior art teaches away from this placement of an ESD resistive load close to the active components and away from the interconnect pad. However, such placement puts the line capacitance before the ESD resistance and therefore the RC constant of the line is lower. Thus, the capacitance of the input circuit and interconnect line can be more easily driven by the external circuitry.

Additionally, the ESD resistors in the circuit of FIG. 3 can be trimmed to take into account the inherent interconnect line resistance that they are coupled to. This allows for the combined resistance for each input line to be set as specified by the circuit design and avoid the additional undesired input resistance. Furthermore, the combined $R_{total}$ for each input can be trimmed to be uniform and the inputs for other lines are predictable (i.e., control signal lines, etc), in other words, $R_{total}=R_{L1}+R_{ESD1}=R_{L2}+R_{ESD2}=R_{L3}+R_{ESD3}$. Or, alternatively the individual RC time constants can be adjusted to uniform ($RC_{L1}=RC_{L2}=RC_{L3}$). An advantage for common usage inputs (i.e., data or address lines) in high speed or synchronous systems.

It is noted that the ESD resistor can be placed at input interconnect pad and similarly trimmed to accommodate the inherent resistance of the interconnect line and produce a predictable and uniform input resistances and RC time constants. However, this approach lacks the advantage of reducing the input RC time constants and line transition times, as the interconnect line capacitance must be charged through the resistance of the ESD resistor placed at the interconnect pad.

In the embodiment of FIG. 3, guard rings may still be placed around the input interconnect pads, ESD resistors, and other input circuits to provide additional ESD event protection. However, in the configuration of the circuit of FIG. 3, the guard rings must be placed near to the active inputs because of the placement of the ESD resistors in the circuit of FIG. 3. Because of this close placement of guard rings, the design should be carefully laid out to avoid problems with latch up.

Figure 4:
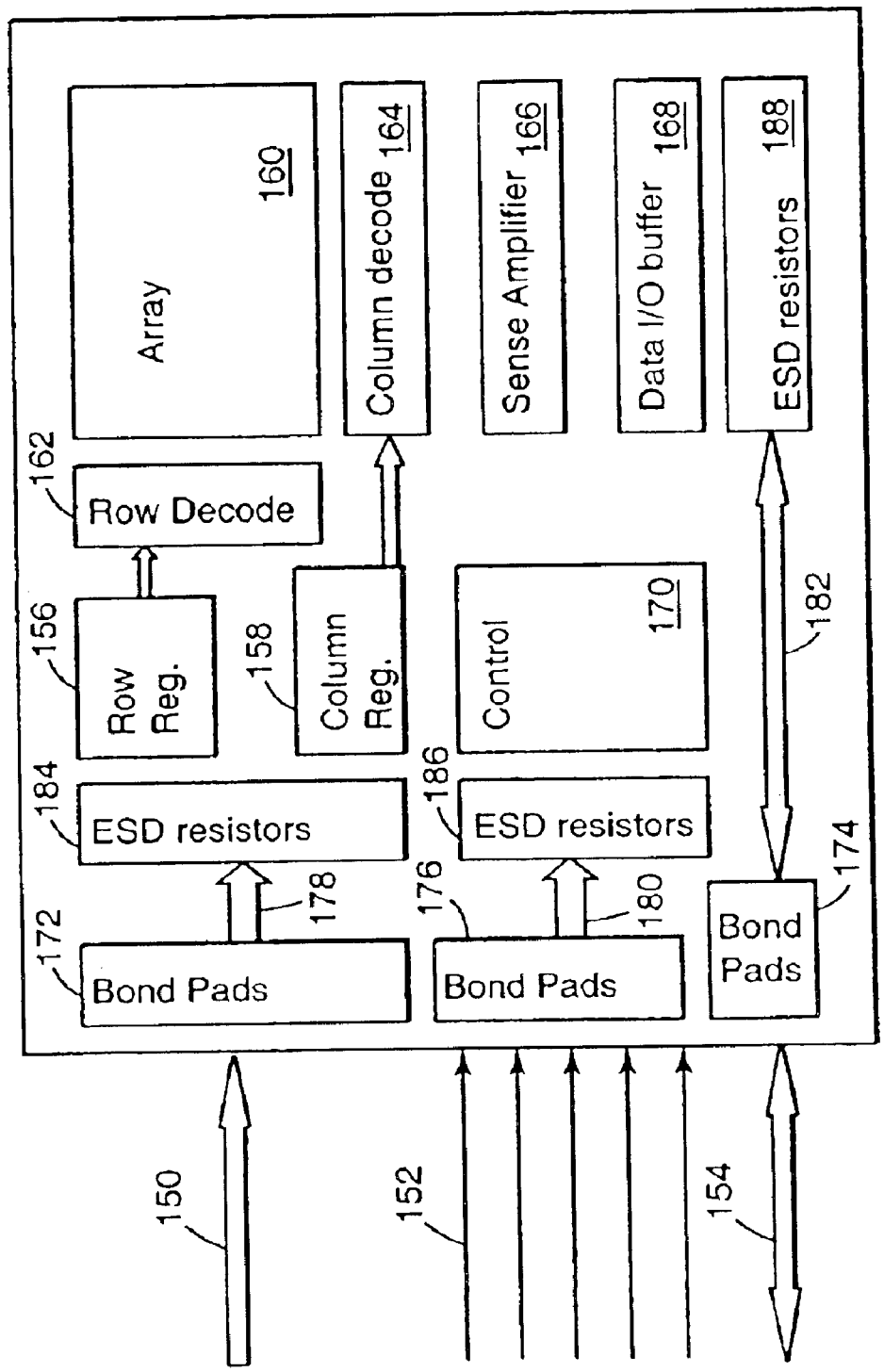
FIG. 4 is a simplified diagram of a memory device with inputs of an embodiment of the present invention.

FIG. 4 shows an example of a non-volatile memory device of an embodiment of the present invention. It is noted that the memory device of FIG. 4 is only shown as an example, and embodiments of the present invention can include multiple types of other integrated circuits (i.e., a processor, a volatile memory device, an ASIC, and etc.). Memory devices are well known in the prior art and the following description is intended only to be an overview of their operation and provide an example of their operation with an embodiment of the present invention.

The non-volatile memory device of FIG. 4 contains an array of non-volatile floating gate memory cells arranged in columns coupled to bit lines as its main memory structure. In the memory device of FIG. 4, address values for the memory are received on the external address bus connections 150. The received address values are stored internal to the memory device and utilized to select the memory cells in the array to read and write data to. In the case of the memory device of FIG. 4, the internal address register is shown split with both a row address register 156 and column address register 158. The address values held in the row address register 156 and column address register 158, select a data word from the non-volatile memory cell array 160 through the coupled row decode 162 and column decode 164 circuits. The selected data word is read by the coupled sense amplifier circuit 166. Data values for the memory device of FIG. 4 are received and transmitted on the bi-directional data word interface 154. Internal to the memory device, data to be written to or from the memory array 160 is held in the Data I/O buffer 168. Control of the memory device of FIG. 4 for both read operations and write operations is actuated by the internal control circuit 170. The control circuit 170 operates in response external control signals received on control signal external interface connections 152 to internal events.

As shown in FIG. 4 all external signal connections to the memory device are coupled to internal interconnect pads on the internal integrated circuit chip (172, 174, and 176). Interconnect pads are shown for each of the major interfaces, address interconnect pads 172, data interconnect pads 174, and control signal interconnect pads 176. Interconnect lines (178, 180, and 182) couple the interconnect pads (172, 174, and 176) to their corresponding ESD resistor circuits (184, 186, and 188) that are implemented proximate to the active component input circuits that accept the incoming signals. The individual ESD resistors in the ESD resistor circuits (184, 186, and 188) can be adjusted in value to account for the interconnect line resistance of the variable length interconnect lines. These input circuits have inherently low RC time constants for the input circuits and resulting propagation delays for better high speed and synchronous performance. Additionally, the input resistances of the common usage lines in the memory device, the address interface 150, and the data interface 154, can be trimmed to match each other in resistance. Alternatively, the resistance of the input line can be adjusted to make the RC time constant/propagation delay of the common usage lines as minimal and as similar as possible for better high speed or synchronous operation.

CONCLUSION

An input circuit for an integrated circuit is described, having an electrostatic discharge circuit. The input circuit incorporates an interconnect pad, an ESD protection resistor, and an interconnect line that are coupled to the active internal components of the integrated circuit. The interconnect pad is coupled to the interconnect line, and the interconnect line is coupled to the ESD protection resistor, which is coupled to the active internal components of the integrated circuit. The ESD protection resistor is positioned physically proximate to the active internal components of the integrated circuit and adjusted in value to account for the intrinsic resistance or RC time constant of the interconnect line. The described invention provides for a predictable input resistance and lower signal propagation delays through the external connection because of lower RC time constants to drive the capacitance of the interconnect. An additional benefit is uniform signal propagation delays for grouped signal lines such as data input output lines or address lines.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. An integrated circuit comprising:
   an interconnect pad;
   an interconnect line having a first end coupled to the interconnect pad;
   a first end of a resistor coupled to an opposite second end of the interconnect line, wherein the resistor is adjusted to compensate for an inherent resistance of the interconnect line; and
   an electrostatic protection circuit coupled to a second end of the resistor.

2. The integrated circuit of claim 1, wherein the resistor is adjusted to select an overall input resistance for the interconnect line, and wherein the overall input resistance includes the inherent resistance of the interconnect line.

3. The integrated circuit of claim 1, wherein the second end of the resistor is coupled to an input circuit that comprises active components.

4. The integrated circuit of claim 3, wherein the resistor is physically proximate to the input circuit that comprises active components.

5. The integrated circuit of claim 1, wherein the interconnect pad is coupled to receive a control signal input.

6. The integrated circuit of claim 1, wherein the interconnect pad is coupled to receive a data input.

7. The integrated circuit of claim 1, wherein the interconnect pad is coupled to receive an address input.

8. The integrated circuit of claim 1, wherein the integrated circuit is a memory device.

9. The integrated circuit of claim 8, wherein the memory device is a non-volatile memory device.

10. The integrated circuit of claim 1, wherein the electrostatic protection circuit is a transistor.

11. The integrated circuit of claim 1, wherein the interconnect line is metal.

12. The integrated circuit of claim 1, wherein the interconnect line is polysilicon.

13. The integrated circuit of claim 1, wherein the resistor is adjusted after fabrication of the integrated circuit.

14. A method for coupling an external signal to the input of an integrated circuit comprising:
    receiving an external signal at an interconnect pad;
    coupling the signal to a conductor line;
    coupling the signal from the conductor line to a first end of a resistor, wherein the resistor has been selectively adjusted to compensate for an internal resistance of the conductor line;
    coupling a second end of the resistor to an electrostatic protection circuit; and
    coupling the signal from the second end of the resistor to an internal circuit.

15. A method of adjusting an integrated circuit for a specific input resistance comprising:
    coupling an interconnect pad to an interconnect line;
    coupling the interconnect line to a first end of a resistor;
    coupling a second end of the resistor to an internal circuit of the integrated circuit;
    coupling the second end of the resistor to an electrostatic protection circuit and to an internal circuit; and
    adjusting the resistor to achieve a specific input resistance for the integrated circuit and compensate for a resistance of the interconnect line.

16. The method of claim 15, wherein adjusting the resistor to achieve a specific input resistance for the integrated circuit further comprises adjusting the resistor to achieve a specific input resistance for the integrated circuit, wherein a component of the specific input resistance includes the resistance of the interconnect line and where the resistor is adjusted to compensate for the resistance of the interconnect line.

17. The method of claim 15, wherein the internal circuit of the integrated circuit comprises active components.

18. The method of claim 15, further comprising locating the resistor physically proximate to the internal circuit of the integrated circuit.

19. The method of claim 15, wherein the integrated circuit is a memory device.

20. The method of claim 19, wherein the memory device is a non-volatile memory device.

21. The method of claim 15, wherein the electrostatic protection circuit is a transistor.

22. The method of claim 15, wherein the interconnect line is metal.

23. The method of claim 15, wherein the interconnect line is polysilicon.

24. The method of claim 15, wherein adjusting the resistor occurs after fabrication of the integrated circuit.

25. A method of adjusting an integrated circuit for a selected input RC time constant comprising:
coupling an interconnect pad to an interconnect line;
coupling the interconnect line to a first end of a resistor;
coupling a second end of the resistor to an internal circuit of the integrated circuit;
adjusting the resistor to achieve the selected input RC time constant for the integrated circuit, compensating for a resistance and capacitance of the interconnect line; and
coupling the second end of the resistor to an electrostatic protection circuit.

26. The method of claim 25, wherein adjusting the resistor to achieve the selected input RC time constant for the integrated circuit, compensating for a resistance and capacitance of the interconnect line further comprises adjusting the resistor to achieve the selected overall input RC time constant for the interconnect line, wherein the selected overall input RC time constant includes a resistance of the interconnect line and where the resistor is adjusted to compensate for an inherent resistance and capacitance of the interconnect line.

27. An electrostatic discharge protection circuit comprising:
an interconnect pad coupled to a first end of a conductor;
a first end of a resistor coupled to a second end of the conductor, wherein the resistor is adjusted to compensate for a resistance of the conductor such that the combined resistance of the resistor and the resistance of the conductor are substantially equal to a predefined value; and
an electrostatic discharge circuit and an internal circuit coupled to a second end of the resistor.

28. The electrostatic discharge protection circuit of claim 27, wherein the conductor comprises metal or polysilicon.

29. The electrostatic discharge protection circuit of claim 28, wherein the electrostatic discharge circuit is a transistor coupled to ground.

30. An electrostatic discharge protection circuit comprising:
a set of interconnect pads, wherein each member of the set of interconnect pads is coupled to a member of a set of interconnects;
a set of resistors, wherein a first end of each member of the set of resistors is coupled to a member of the set of interconnects, and where each resistor is adjusted to select an overall input resistance and to compensate for a resistance of the coupled member of the set of interconnects; and
a set of electrostatic discharge circuits, wherein each member of the set of electrostatic discharge circuits is coupled to a second end of one member of the set of resistors.

31. The electrostatic discharge protection circuit of claim 30, wherein the overall input resistance is uniform across the set of resistors and coupled interconnects.

32. An integrated circuit with electrostatic discharge protection comprising:
an interconnect pad coupled to an interconnect line;
a first end of an electrostatic discharge protection resistor coupled to the interconnect line;
an electrostatic discharge protection circuit coupled to a second end of the electrostatic discharge protection resistor; and
an internal circuit coupled to the second end of the electrostatic discharge protection resistor and physically proximate to the electrostatic discharge protection resistor,
wherein the electrostatic discharge protection resistor is selectively adjusted to compensate for the resistance of the interconnect line and set a selected overall input resistance.

33. A memory device comprising:
an address interface;
a data interface;
a control interface;
a first interconnect coupled to the address interface;
a first conductor coupled to the first interconnect;
a first end of a first resistor circuit coupled to the first conductor, wherein the first resistor circuit is adjusted to compensate for the resistance of the first conductor;
a first electrostatic discharge circuit coupled to a second end of the first resistor circuit;
a second interconnect coupled to the data interface;
a second conductor coupled to the second interconnect;
a first end of a second resistor circuit coupled to the second conductor, wherein the second resistor circuit is adjusted to compensate for the resistance of the second conductor;
a second electrostatic discharge circuit coupled to a second end of the second resistor circuit;
a third interconnect coupled to the control interface;
a third conductor coupled to the third interconnect;
a first end of a third resistor circuit coupled to the third conductor, wherein the third resistor circuit is adjusted to compensate for the resistance of the third conductor; and
a third electrostatic discharge circuit coupled to a second end of the third resistor circuit.

34. The memory device of claim 33, wherein the first, second, and third conductors comprise either metal or polysilicon.

35. The memory device of claim 33, wherein the first, second, and third electrostatic discharge circuits comprise transistors.

* * * * *

UNITED STATES PATENT AND TRADEMARK OFFICE
CERTIFICATE OF CORRECTION

PATENT NO.     : 6,873,507 B2  
DATED          : March 29, 2005  
INVENTOR(S)    : Frankie F. Roohparvar It is certified that error appears in the above-identified patent and that said Letters Patent is hereby corrected as shown below:

Column 5,
Line 30, "Ins" should read -- 1ns --.

Signed and Sealed this

Eighth Day of November, 2005

JON W. DUDAS
*Director of the United States Patent and Trademark Office*